(12) United States Patent
Miles

(10) Patent No.: US 7,012,726 B1
(45) Date of Patent: Mar. 14, 2006

(54) MEMS DEVICES WITH UNRELEASED THIN FILM COMPONENTS

(75) Inventor: Mark W. Miles, San Francisco, CA (US)

(73) Assignee: IDC, LLC, San Francisco, CA (US)

( * ) Notice: Subject to any disclaimer, the term of this patent is extended or adjusted under 35 U.S.C. 154(b) by 1 day.

(21) Appl. No.: 10/700,641

(22) Filed: Nov. 3, 2003

(51) Int. Cl.
G02B 26/00 (2006.01)
H01L 21/302 (2006.01)

(52) U.S. Cl. .................................. 359/245; 359/254
(58) Field of Classification Search ................ 359/245, 359/254, 291, 846; 216/95; 438/738, 749, 438/689
See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,813,265 A | 5/1974 | Marks |
| 3,955,880 A | 5/1976 | Lierke |
| 4,099,854 A | 7/1978 | Decker et al. |
| 4,228,437 A | 10/1980 | Shelton |
| 4,377,324 A | 3/1983 | Durand et al. |
| 4,389,096 A | 6/1983 | Hori et al. |
| 4,403,248 A | 9/1983 | te Velde |
| 4,441,791 A | 4/1984 | Hornbeck |
| 4,445,050 A | 4/1984 | Marks |
| 4,482,213 A | 11/1984 | Piliavin et al. |
| 4,500,171 A | 2/1985 | Penz et al. |
| 4,519,676 A | 5/1985 | te Velde |

(Continued)

FOREIGN PATENT DOCUMENTS

| | | |
|---|---|---|
| EP | 0 667 548 A1 | 8/1995 |
| JP | 05275401 A1 | 10/1993 |
| WO | WO 95/30924 | 11/1995 |
| WO | WO 97/17628 | 5/1997 |
| WO | WO 99/52006 A2 | 10/1999 |
| WO | WO 99/52006 A3 | 10/1999 |
| WO | WO 03/007049 A1 | 1/2003 |
| WO | WO 03/069413 A1 | 8/2003 |
| WO | WO 03/073151 A1 | 9/2003 |
| WO | WO 04/006003 A1 | 1/2004 |
| WO | WO 04/02657 A2 | 4/2004 |

OTHER PUBLICATIONS

U.S. Appl. No. 08/554,630 filed Jul. 31, 1996, Miles.
U.S. Appl. No. 08/744,253, filed Nov. 5, 1996, Miles.
U.S. Appl. No. 08/769,947, filed Dec. 19, 1996, Miles.
U.S. Appl. No. 09/056,975, filed Apr. 8, 1998, Miles.
Fan et al., "Channel Drop Fiters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quantum Electronics, vol. 5, No. 1, pp. 18–25 (Jan./Feb. 1999).

(Continued)

Primary Examiner—Scott J. Sugarman
Assistant Examiner—Richard Hanig
(74) Attorney, Agent, or Firm—Knobbe Martens Olson & Bear LLP

(57) ABSTRACT

In one embodiment, the invention provides a MEMS device. The MEMS device comprises a plurality of functional components including at least one moveable component; and a sacrificial component to at least reduce movement of the moveable component during shipping of the microelectromechanical systems device, wherein the sacrificial component can be removed after shipping.

14 Claims, 3 Drawing Sheets

U.S. PATENT DOCUMENTS

| | | |
|---|---|---|
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsel et al. |
| 4,954,789 A | 9/1990 | Sampsel |
| 4,956,619 A | 9/1990 | Hornbeck |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsel et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,098,279 A | 3/1992 | Effenberger et al. |
| 5,099,353 A | 3/1992 | Hornbeck |
| 5,124,834 A | 6/1992 | Cusano et al. |
| 5,142,405 A | 8/1992 | Hornbeck |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsel |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsel et al. |
| 5,325,116 A | 6/1994 | Sampsel |
| 5,327,286 A | 7/1994 | Sampsel et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsel |
| 5,454,906 A | 10/1995 | Baker et al. |
| 5,457,493 A | 10/1995 | Leddy et al. |
| 5,457,566 A | 10/1995 | Sampsel et al. |
| 5,459,602 A | 10/1995 | Sampsel |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsel |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsel |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsel |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsel |
| 5,619,059 A | 4/1997 | Li et al. |
| 5,619,365 A | 4/1997 | Rhoads et al. |
| 5,619,366 A | 4/1997 | Rhoads et al. |
| 5,636,052 A | 6/1997 | Arney et al. |
| 5,646,768 A | 7/1997 | Kaeiyama |
| 5,650,881 A | 7/1997 | Hornbeck |
| 5,654,741 A | 8/1997 | Sampsel et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,703,710 A | 12/1997 | Brinkman et al. |
| 5,710,656 A | 1/1998 | Goossen |
| 5,726,480 A | 3/1998 | Pister |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,793,504 A | 8/1998 | Stoll |
| 5,808,780 A | 9/1998 | McDonald |
| 5,818,095 A | 10/1998 | Sampsel |
| 5,825,528 A | 10/1998 | Goossen |
| 5,835,255 A | 11/1998 | Miles |
| 5,842,088 A | 11/1998 | Thompson |
| 5,912,758 A | 6/1999 | Knipe et al. |
| 5,943,158 A | 8/1999 | Ford et al. |
| 5,959,763 A | 9/1999 | Bozler et al. |
| 5,972,193 A | 10/1999 | Chou et al. |
| 5,976,902 A | 11/1999 | Shih |
| 5,986,796 A | 11/1999 | Miles |
| 6,028,690 A | 2/2000 | Carter et al. |
| 6,038,056 A | 3/2000 | Florence et al. |
| 6,040,937 A | 3/2000 | Miles |

| | | |
|---|---|---|
| 6,049,317 A | 4/2000 | Thompson et al. |
| 6,055,090 A | 4/2000 | Miles |
| 6,061,075 A | 5/2000 | Nelson et al. |
| 6,099,132 A | 8/2000 | Kaeriyama |
| 6,100,872 A | 8/2000 | Aratani et al. |
| 6,113,239 A | 9/2000 | Sampsel et al. |
| 6,147,790 A | 11/2000 | Meier et al. |
| 6,160,833 A | 12/2000 | Floyd et al. |
| 6,180,428 B1 | 1/2001 | Peeters et al. |
| 6,195,196 B1 | 2/2001 | Kimura et al. |
| 6,201,633 B1 | 3/2001 | Peeters et al. |
| 6,232,936 B1 | 5/2001 | Gove et al. |
| 6,243,149 B1 | 6/2001 | Swanson et al. |
| 6,282,010 B1 | 8/2001 | Sulzbach et al. |
| 6,295,154 B1 | 9/2001 | Laor et al. |
| 6,323,982 B1 | 11/2001 | Hornbeck |
| 6,356,254 B1 | 3/2002 | Kimura |
| 6,376,787 B1 | 4/2002 | Martin et al. |
| 6,447,126 B1 | 9/2002 | Hornbeck |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,358 B1 | 10/2002 | Tew |
| 6,473,274 B1 | 10/2002 | Maimone et al. |
| 6,480,177 B1 | 11/2002 | Doherty et al. |
| 6,496,122 B1 | 12/2002 | Sampsel |
| 6,545,335 B1 | 4/2003 | Chua et al. |
| 6,548,908 B1 | 4/2003 | Chua et al. |
| 6,549,338 B1 | 4/2003 | Wolverton et al. |
| 6,552,840 B1 | 4/2003 | Knipe |
| 6,574,033 B1 | 6/2003 | Chui et al. |
| 6,589,625 B1 | 7/2003 | Kothari et al. |
| 6,600,201 B1 | 7/2003 | Hartwell et al. |
| 6,606,175 B1 | 8/2003 | Sampsell et al. |
| 6,608,268 B1 | 8/2003 | Goldsmith |
| 6,625,047 B1 | 9/2003 | Coleman, Jr., deceased |
| 6,630,786 B1 | 10/2003 | Cummings et al. |
| 6,632,698 B1 | 10/2003 | Ives |
| 6,635,919 B1 | 10/2003 | Melendez et al. |
| 6,643,059 B1 | 11/2003 | Dewald |
| 6,650,455 B1 | 11/2003 | Miles |
| 666,561 A1 | 12/2003 | Blakely |
| 6,657,832 B1 | 12/2003 | Williams et al. |
| 6,674,090 B1 | 1/2004 | Chua et al. |
| 6,674,562 B1 | 1/2004 | Miles |
| 6,680,792 B1 | 1/2004 | Miles |
| 6,710,908 B1 | 3/2004 | Miles et al. |
| 6,741,377 B1 | 5/2004 | Miles |
| 6,741,384 B1 | 5/2004 | Martin et al. |
| 6,741,503 B1 | 5/2004 | Farris et al. |
| 6,747,785 B1 | 6/2004 | Chen et al. |
| 6,756,317 B1 * | 6/2004 | Sniegowski et al. ........ 438/745 |
| 6,778,155 B1 | 8/2004 | Doherty et al. |
| 6,778,306 B1 * | 8/2004 | Sniegowski et al. ........ 359/224 |
| 8,775,174 | 8/2004 | Huffman |
| 6,794,119 B1 | 9/2004 | Miles |
| 6,811,267 B1 | 11/2004 | Allen et al. |
| 6,819,469 B1 | 11/2004 | Koba |
| 6,822,628 B1 | 11/2004 | Dunphy et al. |
| 6,829,132 B1 | 12/2004 | Martin et al. |
| 6,853,129 B1 | 2/2005 | Cummings et al. |
| 6,855,610 B1 | 2/2005 | Tung et al. |
| 6,859,218 B1 | 2/2005 | Luman et al. |
| 6,861,277 B1 | 3/2005 | Monroe et al. |
| 6,862,022 B1 | 3/2005 | Slupe |
| 6,862,029 B1 | 3/2005 | D'Souza et al. |
| 6,867,896 B1 | 3/2005 | Miles |
| 6,870,581 B1 | 3/2005 | Li et al. |
| 2001/0003487 A1 | 6/2001 | Miles |
| 2001/0040649 A1 | 11/2001 | Ozaki |
| 2002/0015215 A1 | 2/2002 | Miles |
| 2002/0071169 A1 | 6/2002 | Bowers et al. |
| 2002/0075555 A1 | 6/2002 | Miles |
| 2002/0126364 A1 | 9/2002 | Miles |
| 2002/0135857 A1 | 9/2002 | Fitzpatrick et al. |
| 2003/0043157 A1 | 3/2003 | Miles |
| 2003/0062186 A1 | 4/2003 | Boroson et al. |
| 2003/0072070 A1 | 4/2003 | Miles |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0058532 A1 | 3/2004 | Miles et al. |
| 2004/0061543 A1 | 4/2004 | Nam et al. |
| 2004/0080807 A1 | 4/2004 | Chen et al. |
| 2004/0145049 A1 | 7/2004 | McKinne et al. |
| 2004/0147056 A1 | 7/2004 | McKinnie et al. |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0179281 A1 | 9/2004 | Reboa |
| 2004/0212026 A1 | 10/2004 | Van Brooklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brooklin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0038950 A1 | 2/2005 | Adelmann |
| 2005/0057442 A1 | 3/2005 | Way |
| 2005/0068583 A1 | 3/2005 | Gutkows et al. |
| 2005/0069209 A1 | 3/2005 | Damera-Venkata et al. |

OTHER PUBLICATIONS

Ibbotson et al., "Comparison of XeF2 and F–atom reactions with Si and SiO2," Applied Physics Letters, vol. 44, No. 12, pp. 1129–1131 (Jun. 1984).

Joannopoulos et al., "Photonics Crystals: Molding the Flow of Light," Princeton University Press (1995).

Kim et al., "Control of Optical Transmission Through Metals Perforated With Subwavelength Hole Arrays," Optic Letters, vol. 24, No. 4, pp. 256–257 (Feb. 1999).

Lin et al., "Free–Space Micromachined Optical Switches for Optical Networking," IEEE Journal of Selected Topics in Quantum Electronics, vol. 5, No. 1, pp. 4–9 (Jan./Feb. 1999).

Little et al. "Vertically Coupled Microring Resonator Channel Dropping Filter," IEEE Photonics Technology Letters, vol. 11, No. 2 (1999).

Magel, "Integrated Optic Devices Using Micromachined Metal Membranes," SPIE vol. 2686, 0–8194–2060–Mar. (1996).

Nagami, "Plastic–Cell Architecture: Towards Reconfigurable Computing For General–Purpose," IEEE, 0–8186–8900–, pp. 68–77 (May 1998).

Schnakenberg et al., "TMAHW Etchants for Silicon Micromachining," 1991 International Conference on Solid State Sensors and Actuators–Digest of Technical Papers, pp. 815–818 (1991).

Williams et al., "Etch Rates for Micromachining Processing," Journal of Microelectromechanical Systems, vol. 5, No. 4, pp. 256–259 (Dec. 1996).

Winters et al., "The etching of silicon with XeF$_2$ vapor. Applied Physics Letters," vol. 34, No. 1, pp. 70–73 (Jan. 1979).

Zhou et al., "Waveguide Panel Display Using Electromechanical Spatial Modulators" SID Digest, vol. XXIX (1998).

PCT/US02/13442, Search Report Sep. 13, 2002.

PCT/US04/20330 Search Report Nov. 8, 2004.

Akasaka, "Three–Dimensional IC Trends," Proceedings of IEEE, vol. 74, No. 12, pp. 1703–1714 (Dec. 1986).

Aratani et al., "Process and Design Considerations for Surface Micromachined Beams for a Tuneable Interferometer Array in Silicon," Proc. IEEE Microelectromechanical Workshop, Fort Lauderdale, Fl. pp. 230–235 (Feb. 1993).

Aratani et al., "Surface micromachined tuneable interferometer array," Sensors and Actuators, pp. 17–23 (1994).

Conner, "Hybrid Color Display Using Optical Interference Filter Array," SID Digest, pp. 577–580 (1993).

Goossen et al., "Possible Display Applications of the Silicon Mechanical Anti–Reflection Switch," Society for Information Display (1994).

Goossen et al., "Silicon Modulator–Based on Mechanically–Active Anti–Reflection Layer with 1Mbit/sec Capability for Fiber–in–the–Loop Applications," IEEE Photonics Technology Letters, pp. 1119, 1121 (Sep. 1994).

Gosch, "West Germany Grabs the Lead in X–Ray Lithography," Electronics, pp. 78–80 (Feb. 5, 1987).

Howard et al., "Nanometer–Scale Fabrication Techniques," VLSI Electronics: Microstructure Science, vol. 5, pp. 145–153, and pp. 166–173 (1982).

Jackson, "Classical Electrodynamics," John Wiley & Sons Inc., pp. 568–573 (date unknown).

Jerman et al., "A Miniature Fabry–Perot Interferometer with a Corrugated Silicon Diaphragm Support," IEEE Electron Devices Society (1998).

Johnson, "Optical Scanners," Microwave Scanning Antennas, vol. 1, pp. 251–261 (1964).

"Light over Matters," Circle No. 36 (Jun. 1993).

Miles, "A New Reflective FPD Technology Using Interferometric Modulation," Society for Information Display '97 Digest, Session 7.3 (1997).

Newsbreaks, "Quantum–trench devices might operate at terahertz frequencies," Laser Focus World (May 1993).

Oliner et al., "Radiating Elements and Mutual Coupling," Microwave Scanning Antennas, vol. 2, pp. 131–157 and pp. 190–194 (1966).

Raley et al., "A Fabry–Perot Microinterferometer for Visible Wavelengths," IEEE Solid–State Sensor and Actuator Workshop, Hilton Head, SC (1992).

Sperger et al., "High Performance Patterned All–Dielectric Interference Colour Filter for Display Applications," SID Digest, pp. 81–83 (1994).

Stone, "Radiation and Optics, An Introduction to the Classical Theory," McGraw–Hill, pp. 340–343 (1963).

Walker et al., "Electron–beam–tunable Interference Filter Spatial Light Modulator," Optics Letters vol. 13, No. 5, pp. 345–347 (May 1988).

Winton, "A novel way to capture solar energy," Chemical Week, pp. 17–18 (May 15, 1985).

Wu et al., "Design of a Reflective Color LCD Using Optical Interference Reflectors," ASIA Display '95, pp. 929–931 (Oct. 16, 1995).

Goossen et al., "Possible Display Applications of the Silicon Mechanical Anti–Reflection Switch," Society for Information Display (1994).

Goossen et al., "Silicon Modulator Based on Mechanically–Acitve Anti–Reflection Layer with 1Mbit/sec Capability for Fiber–in–the–Loop Applications," IEEE Photonics Technology Letters, pp. 1119, 1121 (Sep. 1994).

Gosch, "West Germany Grabs the Lead in X–Ray Lithography," Electronics pp. 78–80 (Feb. 5, 1987).

Howard et al., "Nanometer–Scale Fabrication Techniques," VLSI Electronics: Microstructure Sciene, vol. 5, pp. 145–153, and pp. 166–173 (1982).

Jackson, "Classical Electrodynamics," John Wiley & Sons Inc., pp. 568–573 (date unknown).

Jerman et al., "A Miniature Fabry–Perot Interferometer with a Corrugated Silicon Diaphragm Support," IEEE Electron Devices Society (1998).

Johnson, "Optical Scanners," Microwave Scanning Antennas, vol. 1, pp. 251–261 (1964).

"Light over Matter," Circle No. 36 (Jun. 1993).

Miles, "A New Reflective FPD Technology Using interferometric Modulation," Society for Information Display '97 Digest, Session 7.3 (1997).

Newsbreaks, "Quantum–trench devices might operate at terahertz frequencies," Laser Focus World (May 1993).

Oliner et al., "Radiating Elements and Mutual Coupling," Microwave Scanning Antennas, vol. 2, pp. 131–157 and pp. 190–194 (1966).

Raley et al., "A Fabry–Perot Microinterferometer for Visible Wavelengths," IEEE Solid–State Sensor and Actuator Workshop, Hilton Head SC (1992).

Sperger et al., "High Performance Patterned All–Dielectric Interference Colour Filter for Display Applications," SID Digest, pp. 81–83 (1994).

Stone, "Radiation and Optics, An Introduction to the Classical Theory," McGraw–Hill, pp. 340–343 (1963).

Walker et al., "Electron–beam–tunable Interference Filter Spatial Light Modulator," Optics Letters vo. 13, No. 5, pp. 345–347 (May 1988).

Winton, "A novel way to capture solar energy," Chemical Week, pp. 17–18 (May 15, 1985).

Wu et al., "Design of a Reflective Color LCD Using Optical Interference Reflectors," ASIA Display '95, pp. 929–931 (Oct. 16, 1995).

* cited by examiner

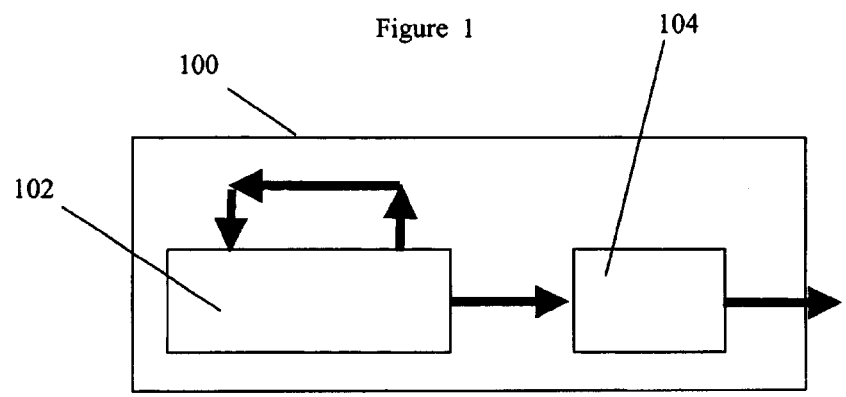
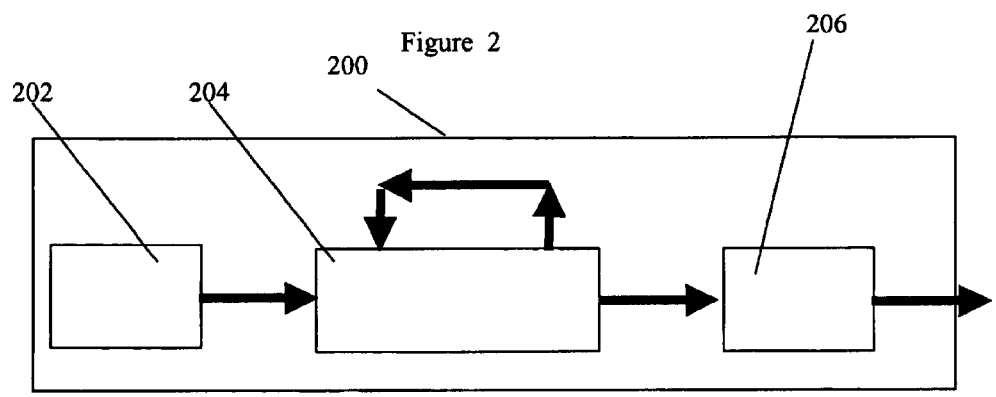

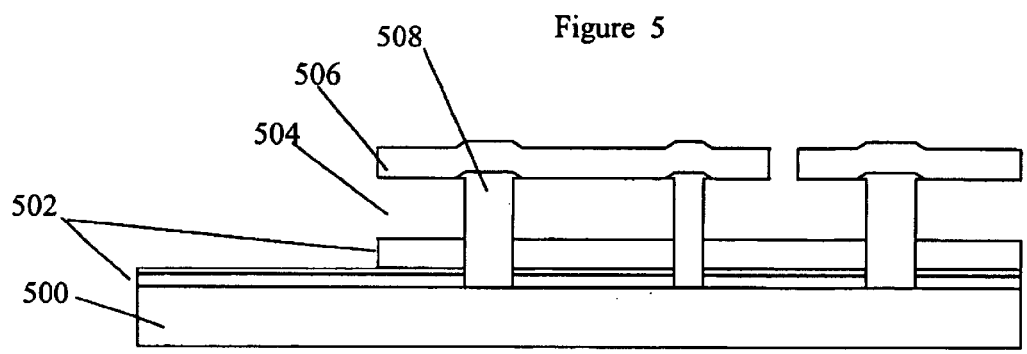

MEMS DEVICES WITH UNRELEASED THIN FILM COMPONENTS

FIELD OF THE INVENTION

This invention relates generally to fabrication processes for microelectromechanical systems (MEMS) devices and more specifically to the manufacture of interferometric modulators (iMoDs).

BACKGROUND OF THE INVENTION

An interferometric modulator is a class of MEMS (microelectromechanical) systems devices which have been described and documented in a variety of patents including U.S. Pat. Nos. 5,835,255, 5,986,796, 6,040,937, 6,055,090, and U.S. Pending patent application Ser. Nos. 09/966,843, 09/974,544,10/082,397,10/084,893, and 10/078,282, herein incorporated by reference.

One process for fabricating MEMS devices falls under the label of "surface micromachining" and comprises a sequence of deposition and etch steps that are repeated until a final step or release step. Such a process can often start with some kind of raw material in the form of films or thin film precursors which are deposited beforehand. These precursors may represent a definable component, which can be manufactured in high volumes in dedicated facilities. A more detailed description of this component is provided in patent application Ser. No. 10/606,001 herein incorporated by reference.

Surface micromachining includes monolithic semiconductor-like fabrication processes. Specifically, surface micromachining comprises a sequence of steps that combine film deposition, photolithography, and etching using a variety of techniques. Precursor films can be used as a starting point for the sequence which eventually results in a MEMS device with mechanical structures that can move. More detail on these processes is described in patent application Ser. No. 10/074,562 filed on Feb. 12, 2002 and herein incorporated by reference.

During shipping of the MEMS device, movement of the mechanical structures can occur and may result in damage to the MEMS device.

BRIEF DESCRIPTION OF THE DRAWINGS

FIG. 1 shows a block diagram for a fully integrated MEMS processing facility as illustrated in the prior art.

FIG. 2 shows block diagram for a fully integrated MEMS processing facility incorporating precursor film deposition, structure processing, and backend processing.

FIG. 5 shows a MEMS device which is has been released

DETAILED DESCRIPTION OF THE INVENTION

Figure 3:
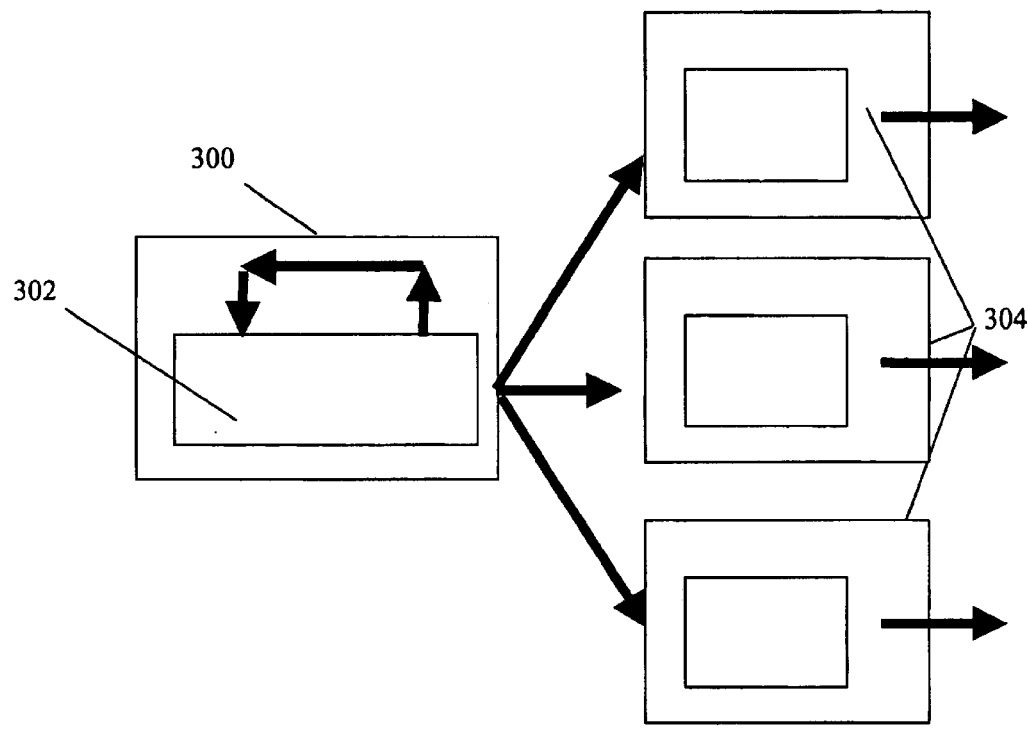
FIG. 3 shows a block diagram for a non-integrated MEMS processing facility incorporating structure processing and backend processing.

In the following detailed description of embodiments of the invention, numerous specific details are set forth such as examples of specific materials, machines, and methods in order to provide a thorough understanding of the present invention. It will be apparent, however, to one skilled in the art that these specific details need not be employed to practice the present invention. In other instances, well known materials, machines, or methods have not been described in detail in order to avoid unnecessarily obscuring the present invention.

Broadly, in accordance with one embodiment of the invention, a MEMS device including a moveable component is fabricated, and the movement of the moveable component is inhibited using a sacrificial material, so that damage to the moveable component during shipping is at least reduced. In one embodiment, the sacrificial material is deposited during fabrication of the MEMS device, and the sacrificial material is removed during a release step after shipping. Removal of the sacrificial material may be by a chemical or related etch process, and results in the freeing of the moveable component. Thus, embodiments of the present invention disclose fabricating a MEMS device to the point of release but not beyond, and represent a component that may be readily manufactured in a high-volume dedicated facility. This component may then be conveniently removed to another factory where the release step and subsequent processing and packaging steps can be performed. One advantage of the present invention is that it allows entities that wish to fabricate MEMS devices, or perform post-fabrication operations on the MEMS device after shipping to operate in their respective spaces with the benefit of a low technological barrier-to-entry and reduced capital outlay since integrated facilities that fabricate the MEMS device and also perform the post-fabrication release and processing steps represent a higher technological barrier and require more capital outlay than separate facilities. Other advantages of the present invention will be apparent from the description below.

Patent application Ser. No. 10/606,001 filed on Jun. 24, 2003, describes a collection of deposited thin films, which can be used as precursor materials for the manufacture of iMoDs. Patent application Ser. No. 10/074,562 filed on Feb. 12, 2002 and, herein incorporated by reference, describes a prototypical fabrication sequence or structure process for building interferometric modulators, which can utilize the aforementioned precursor materials. FIG. 1 represents a single factory, 100, which contains two sections of manufacture, 102, which generates the thin film precursor material, and 104, which performs the structure processing that results in a finished MEMS structure or structures.

FIG. 2 is a more complete representation of the MEMS manufacturing chain. In FIG. 2, integrated factory 200, includes section 202, for precursor processing, section 204, for structure processing, and section 206, for backend processing. Backend processing generally refers to processes which interface a MEMS component to the outside world which can include device packaging, interconnection to external electronics and interfaces (i.e. drivers and touch screens for displays), interconnection to and integration with peripheral components (such as supplemental lighting for displays) and others. While these processes can be handled within a large integrated factory, they are often performed in dedicated facilities, which perform no other activities. For MEMS components and particularly for displays, this requires that there be a component which can be readily and easily transferred from the facility which defined it, the structure process section in this example, to the facility which will perform the backend process.

FIG. 3 illustrates this idea and its benefits conceptually. In FIG. 3, reference numeral 300 indicates a factory which performs only the structural processing on precursor films which have been supplied to it from another facility. It should be noted, of course, that if economics or other factors merit it this facility could perform both precursor processing and structural processing. In either case, economies of scale can be achieved by performing the structural processing or structural and precursor processing in a single facility 300. The resulting component can then be supplied to one or more backend processing facilities, 304, for further completion of the finished MEMS product.

Figure 4:
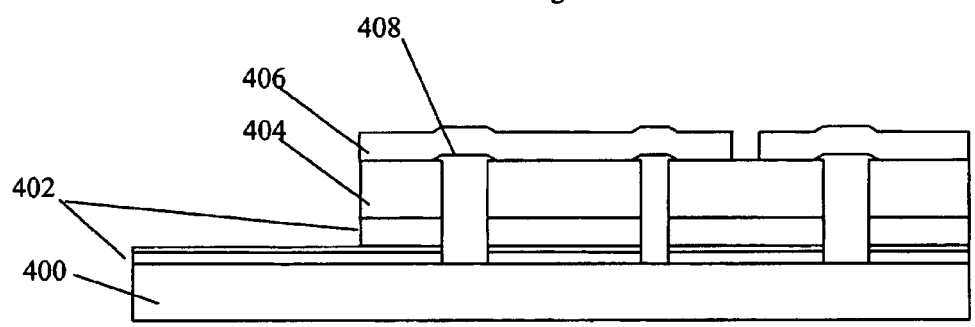
FIG. 4 shows a MEMS device which is has been fabricated to the point of being ready to release

For the structures and processes described in the aforementioned applications, a convenient point within the structural process to transfer the work product to backend processing is just before the release step. FIG. 4 illustrates one kind of MEMS device, an iMoD, which resides at this point in the processing sequence. Referring to FIG. 4, reference numeral 400 indicates a substrate upon which optical thin films, 402, have been deposited and patterned. Sacrificial film, 404, has been deposited and patterned and resides above optical films 402, and mechanical film, 406, resides on and is mechanically coupled to sacrificial film 404, and support posts 408.

In FIG. 5, the release step has occurred. Specifically, the sacrificial film has been removed leaving an airgap, 504, in its place. Support posts, 508, remain to mechanically couple the mechanical membrane, 506, to the substrate. However, the mechanical membrane is now free to move according to the function of its design. This release step is the result of a chemical etch process which utilizes an etchant to convert the sacrificial material into a byproduct which can be easily extracted in the form of a gas or a liquid. It is at this point that the device is ready to be packaged and interconnected as part of the backend process, though in some cases some backend processes may occur before release.

Regardless, transferring the MEMS component from one facility to another in the unreleased state is the preferred state for at least several reasons. First, no matter how well crafted the shipping containers are, there is always the possibility that the components to be shipped may be exposed to contaminants or other undesired particles or materials. Maintaining the component in the unreleased state minimizes the risk that such contaminants will be incorporated into the structure, and makes it easier to clean the component when it arrives a the backend facility. The MEMS component is also more stable from a mechanical standpoint. Thus, it is more resistant to extremes in environment such as temperature and mechanical shock which may occur during transport. Additionally, these components are more amenable to storage or stockpiling which might be beneficial under certain manufacturing scenarios or situations. Finally, the process tools required for performing the release step are relatively simple and inexpensive to acquire. Facilities and associated staff may, while expert in the tools and techniques required for backend processing may not be so facile with those that occur upstream in the structural processing section. Making the transfer at the unreleased stage lowers the technology and skill set barriers and speeds the manufacturing learning curves these teams have to deal with in preparing to manufacture iMoDs and other MEMS components. For components in the display arena, which usually involve large substrates with many displays, this component is referred to as a "ready-to-release-plate".

What is claimed is:

1. A method, comprising:
    fabricating a microelectromechanical systems device comprising a movable component;
    inhibiting at least some movement of the movable component with a sacrificial material, so that the microelectromechanical systems device can be transported with at least a reduced risk of damage to the movable component;
    transporting said device;
    removing the sacrificial material after the miroelectromechanical systems device has been transported; and
    packaging the microelectronical systems device.

2. The method of claim 1, wherein the removing comprises removing the sacrificial material with a gas etchant.

3. The method of claim 1, further comprising removing the sacrificial material after the microelectromechanical systems device has been transported.

4. The method of claim 1, wherein the microelectromechanical systems device comprises all functional components to enable full functioning of the microelectromechanical systems device upon removal of the sacrificial material.

5. The method of claim 1, wherein the microelectromechanical systems device comprises interferometric modulators.

6. The method of claim 1, wherein said sacrificial material is deposited on an optical film.

7. The method of claim 6, wherein a mechanical film is deposited on said sacrificial material.

8. A method of packaging an electronic device comprising an interferometric modulator, comprising:
    fabricating an interferometric modulator comprising a movable component; inhibiting movement of the movable component with a sacrificial material; transporting the interferometric modulator; removing the sacrificial material after the interferometric modulator has been transported; and packaging the interferometric modulator into an electronic device.

9. The method of claim 8, wherein the removing comprises removing the sacrificial material with a gas etchant.

10. The method of claim 8, wherein the interferometric modulator comprises all functional components to enable full functioning of the interferometric modulator upon removal of the sacrificial material.

11. The method of claim 8, wherein the sacrificial material is deposited during the fabricating.

12. The method of claim 8, wherein said sacrificial material is deposited on an optical film.

13. The method of claim 12, wherein a mechanical film is deposited on said sacrificial material.

14. The method of claim 8, wherein the interferometric modulator is part of an interferometric modulator array.

\* \* \* \* \*

UNITED STATES PATENT AND TRADEMARK OFFICE
CERTIFICATE OF CORRECTION

PATENT NO. : 7,012,726 B1
APPLICATION NO. : 10/700641
DATED : March 14, 2006
INVENTOR(S) : Mark W. Miles It is certified that error appears in the above-identified patent and that said Letters Patent is hereby corrected as shown below:

On the title page of the patent under References Cited, please add the following U.S. PATENT DOCUMENTS:

| | | |
|---|---|---|
| 3,725,868 | 4/1973 | Malmer, Jr. et al. |
| 4,196,396 | 4/1980 | Smith |
| 4,459,182 | 7/1984 | te Velde |
| 4,937,496 | 6/1990 | Neiger et al. |
| 5,136,669 | 8/1992 | Gerdt |
| 5,142,414 | 8/1992 | Koehler |
| 5,228,013 | 7/1993 | Bik |
| 5,324,683 | 6/1994 | Fitch et al. |
| 5,326,430 | 7/1994 | Cronin et al. |
| 5,345,328 | 9/1994 | Fritz et al. |
| 5,381,232 | 1/1995 | van Wijk |
| 5,503,952 | 4/1996 | Suzuki et al. |
| 5,526,327 | 6/1996 | Cordova, Jr. |
| 5,552,925 | 9/1996 | Worley |
| 5,622,814 | 4/1997 | Miyata et al. |
| 5,629,790 | 5/1997 | Neukermans et al. |
| 5,633,652 | 5/1997 | Kanbe et al. |
| 5,636,185 | 6/1997 | Brewer et al. |
| 5,638,084 | 6/1997 | Kalt |
| 5,638,946 | 6/1997 | Zavracky |
| 5,641,391 | 6/1997 | Hunter et al. |
| 5,673,139 | 9/1997 | Johnson |
| 5,674,757 | 10/1997 | Kim |
| 5,683,591 | 11/1997 | Offenberg |
| 6,284,560 | 9/2001 | Jech et al. |
| 6,677,225 | 01/2004 | Ellis et al. |
| 6,812,482 | 11/2004 | Fleming, et al. |

On the title page of the patent under References Cited, please add the following under OTHER PUBLICATIONS:

| | | |
|---|---|---|
| 2003/152872 | 8/2003 | Miles, Mark W. |

UNITED STATES PATENT AND TRADEMARK OFFICE
CERTIFICATE OF CORRECTION

| | |
|---|---|
| PATENT NO. | : 7,012,726 B1 |
| APPLICATION NO. | : 10/700641 |
| DATED | : March 14, 2006 |
| INVENTOR(S) | : Mark W. Miles |

It is certified that error appears in the above-identified patent and that said Letters Patent is hereby corrected as shown below:

On the title page of the patent under References Cited, please add the following under FOREIGN PATENT DOCUMENTS:

WO 0114248 3/2001
PCT/US02/13442 Search Report 9/13/02
PCT/US04/20330 Search Report 11/8/2004
PCT/US2004/035820 International Search Report and Written Opinion (04.11.2005)
PCT/US96/11731 Search Report
Sriharan, et al. "Post-Packaging Release a New Concept for Surface-Micromachined Devices" Technical Digest, IEEE Solid-State Sensor & Actuator Workshop, New York, NY, US, November 8, 1998, pp. 225-228, XP000992464

Page 1, Column 2, Entry 11, Delete "WO 04/02657" and insert -- WO/04/026757 --, therefor.
Page 1, Column 2, Line 1, Delete "Jul. 31, 1966," and insert -- Jun. 11, 1995, --, therefor.
Page 1, Column 2, Line 3, Delete "moveable" and insert -- movable --, therefor.
Page 1, Column 2, Line 5, Delete "Fiters" and insert -- Filters --, therefor.
Page 1, Column 2, Line 5, Delete "moveable" and insert -- movable --, therefor.
Page 2, Column 1, Line 13, Delete "Sampsel et al." and insert -- Sampsell et al. --, therefor.
Page 2, Column 1, Line 14, Delete "Sampsel" and insert -- Sampsell --, therefor.
Page 2, Column 1, Line 20, Delete "Sampsel et al." and insert -- Sampsell et al. --, therefor.
Page 2, Column 1, Line 27, Delete "5,098,279 Effenberger et al." and insert -- 5,096,279 Hornbeck --, therefor.
Page 2, Column 1, Line 36, Delete "Sampsel" and insert -- Sampsell --, therefor.
Page 2, Column 1, Line 57, Delete "Sampsel et al." and insert -- Sampsell et al. --, therefor.
Page 2, Column 1, Line 58, Delete "Sampsel" and insert -- Sampsell --, therefor.
Page 2, Column 1, Line 59, Delete "Sampsel et al." and insert -- Sampsell et al. --, therefor.
Page 2, Column 1, Line 69, Delete "Sampsel" and insert -- Sampsell --, therefor.
Page 2, Column 2, Line 2, Delete "Sampsel et al." and insert -- Sampsell et al. --, therefor.
Page 2, Column 2, Line 3, Delete "Sampsel" and insert -- Sampsell --, therefor.

UNITED STATES PATENT AND TRADEMARK OFFICE
CERTIFICATE OF CORRECTION

PATENT NO. : 7,012,726 B1
APPLICATION NO. : 10/700641
DATED : March 14, 2006
INVENTOR(S) : Mark W. Miles It is certified that error appears in the above-identified patent and that said Letters Patent is hereby corrected as shown below:

Page 2, Column 2, Line 14, Delete "Sampsel" and insert -- Sampsell --, therefor.
Page 2, Column 2, Line 23, Delete "Sampsel" and insert -- Sampsell --, therefor.
Page 2, Column 2, Line 30, Delete "Sampsel" and insert -- Sampsell --, therefor.
Page 2, Column 2, Line 37, Delete "Sampsel" and insert -- Sampsell --, therefor.
Page 2, Column 2, Line 44, Delete "Sampsel et al." and insert -- Sampsell et al. --, therefor.
Page 2, Column 2, Line 59, Delete "Sampsel" and insert -- Sampsell --, therefor.
Page 3, Column 1, Line 6, Delete "Sampsel et al." and insert -- Sampsell et al. --, therefor.
Page 3, Column 1, Line 26, Delete "Sampsel" and insert -- Sampsell --, therefor.
Page 3, Column 1, Line 40, Delete "6,643,059" and insert -- 6,643,069 --, therefor.
Page 3, Column 1, Line 41, After "6,650,455" delete "B1" and insert -- B2 --, therefor.
Page 3, Column 1, Line 42, Delete "666,561" and insert -- 6,666,561 --, therefor.
Page 3, Column 1, Line 46, After "6,680,792" delete "B1" and insert -- B2 --, therefor.
Page 3, Column 1, Line 47, After "6,710,908" delete "B1" and insert -- B2 --, therefor.
Page 3, Column 1, Line 48, After "6,741,377" delete "B1" and insert -- B2 --, therefor.
Page 3, Column 1, Line 55, Delete "8,775,174" and insert -- 6,775,174 --, therefor.
Page 3, Column 1, Line 56, After "6,794,119" delete "B1" and insert -- B2 --, therefor.
Page 3, Column 2, Line 4, Delete ""Photonics" and insert -- "Photonic --, therefor.
Page 3, Column 2, Line 17, Delete "McKinne et al." and insert -- McKinnell et al. --, therefor.
Page 3, Column 2, Line 18, Delete "McKinnie et al." and insert -- McKinnell et al. --, therefor.
Page 3, Column 2, Line 19, Delete "Nagami," and insert -- Nagami et al., --, therefor.
Page 3, Column 2, Line 19, Delete ""Plastic–Cell" and insert -- "Plastic Cell --, therefor.
Page 3, Column 2, Line 25, Delete "Pichl et al." and insert -- Piehl et al. --, therefor.
Page 3, Column 2, Line 37, Delete "Gutkows et al." and insert -- Gutkowski et al. --, therefor.
Page 3, Column 2, Line 32, Delete "XeF2" and insert -- $XeF_2$ --, therefor.
Page 3, Column 2, Line 33, Delete "SiO2" and insert -- $SiO_2$ --, therefor.
Page 4, Column 1, Line 13, Delete "Fl." and insert -- FL, --, therefor.
Page 4, Column 1, Line 21, Delete "Modulator–Based" and insert -- Modulator Based --, therefor.
Page 4, Column 1, Line 37, Delete "Matters,"" and insert -- Matter," --, therefor.
Column 1, Line 57, After "release" insert -- . --.
Column 1, Line 58, After "released" insert -- . --.

UNITED STATES PATENT AND TRADEMARK OFFICE
CERTIFICATE OF CORRECTION

PATENT NO. : 7,012,726 B1
APPLICATION NO. : 10/700641
DATED : March 14, 2006
INVENTOR(S) : Mark W. Miles It is certified that error appears in the above-identified patent and that said Letters Patent is hereby corrected as shown below:

Column 3, Line 40, After "arrives" delete "a" and insert -- at --, therefor.
Column 4, Lines 13-14, In Claim 1, delete "miroelectromechanical" and insert
-- microelectromechanical --, therefor.
Column 4, Line 15, In Claim 1, delete "microelectronical" and insert
-- microelectromechanical --, therefor.
Column 4, Lines 18-21, In Claim 3, delete "further comprising removing the sacrificial material after the microelectromechanical systems device has been transported" and insert -- wherein the sacrificial material is deposited during the fabricating--, therefor.

Signed and Sealed this

Twenty-sixth Day of August, 2008

JON W. DUDAS
*Director of the United States Patent and Trademark Office*